(12) United States Patent
Wichert et al.

(10) Patent No.: US 11,632,855 B2
(45) Date of Patent: Apr. 18, 2023

(54) ARRANGEMENT FOR CONDUCTING HEAT AWAY FROM AN ELECTRONIC COMPONENT

(71) Applicant: Andreas Stihl AG & Co. KG, Waiblingen (DE)

(72) Inventors: Rene Wichert, Durlangen (DE); Martin Fieseler, Essen (DE)

(73) Assignee: Andreas Stihl AG & Co. KG, Waiblingen (DE)

( * ) Notice: Subject to any disclaimer, the term of this patent is extended or adjusted under 35 U.S.C. 154(b) by 0 days.

(21) Appl. No.: 17/352,539

(22) Filed: Jun. 21, 2021

(65) Prior Publication Data

US 2021/0410271 A1   Dec. 30, 2021

(30) Foreign Application Priority Data

Jun. 30, 2020   (EP) ..................... 20183240

(51) Int. Cl.
*H05K 1/02* (2006.01)
*H01L 23/367* (2006.01)
*H05K 7/20* (2006.01)

(52) U.S. Cl.
CPC ....... *H05K 1/0209* (2013.01); *H01L 23/3672* (2013.01); *H05K 7/209* (2013.01);
(Continued)

(58) Field of Classification Search
CPC ......... H05K 1/0201–0212; H05K 1/11; H05K 1/181; H05K 3/0061; H05K 3/321; H05K 3/341; H05K 7/20; H05K 7/2039; H05K 7/20454; H05K 7/205; H05K 7/2089–209; H05K 7/20854; H05K 2201/06; H05K 2201/066; H05K 2201/09745; H05K 2201/10227; H05K 2201/10545;
(Continued)

(56) References Cited

U.S. PATENT DOCUMENTS

| 4,879,629 A | * | 11/1989 | Tustaniwskyj | ...... H01L 23/4332 257/E23.091 |
| 4,888,637 A | * | 12/1989 | Sway-Tin | ........... H01L 23/4006 257/E23.084 |
| 6,356,448 B1 | | 3/2002 | DiBene, II et al. | |

(Continued)

FOREIGN PATENT DOCUMENTS

| DE | 10 2010 030 525 A1 | 12/2011 |
| DE | 10 2015 210 099 A1 | 8/2016 |
| WO | 01/33927 A1 | 5/2001 |

*Primary Examiner* — Zachary Pape
*Assistant Examiner* — Amir A Jalali
(74) *Attorney, Agent, or Firm* — Walter Ottesen, P.A.

(57) ABSTRACT

The invention is directed to an arrangement for dissipating heat of an electronic component mounted on a circuit board. The arrangement includes a heat sink for dissipating heat of an electronic component. In order for bottom heat of the electronic component to be dissipated, at least one heat-dissipating heat conducting section is configured on the circuit board, wherein the heat sink is connected in a heat transmitting manner to the heat conducting section of the circuit board. The heat sink by way of a foot section bears directly on the heat conducting section of the circuit board. A recess is configured in the base body of the heat sink, wherein the electronic component lies at least partially in the recess.

16 Claims, 7 Drawing Sheets

(52) U.S. Cl.
CPC ...... *H01L 23/3675* (2013.01); *H05K 7/20509* (2013.01); *H05K 2201/066* (2013.01)

(58) Field of Classification Search
CPC ............ H05K 2201/1056; H01L 23/34; H01L 23/36; H01L 23/367; H01L 23/373; H01L 23/3672; H01L 23/3677; H01L 23/40; H01L 23/42; H01L 23/433; H01L 23/467; B21D 53/02; F28F 3/06
See application file for complete search history.

(56) References Cited

U.S. PATENT DOCUMENTS

| | | | | |
|---|---|---|---|---|
| 6,882,041 B1* | 4/2005 | Cheah | ................ | H01L 23/3737 257/667 |
| 7,203,065 B1* | 4/2007 | Sin Yan Too | ....... | H01L 23/4006 361/709 |
| 10,980,103 B2* | 4/2021 | Götz | .................. | H05K 7/20927 |
| 2002/0159233 A1* | 10/2002 | Patel | .................. | H05K 7/20727 361/702 |
| 2008/0001277 A1* | 1/2008 | Wen | ........................ | H01L 23/10 257/E23.102 |
| 2009/0024345 A1* | 1/2009 | Prautzsch | ............... | H01L 23/34 361/720 |
| 2011/0155360 A1* | 6/2011 | Liu | ..................... | H01L 23/3675 165/185 |
| 2011/0255850 A1* | 10/2011 | Dinh | ..................... | H01L 23/552 396/176 |
| 2015/0208541 A1* | 7/2015 | Loibl | ................... | H05K 5/0213 361/752 |
| 2015/0260390 A1* | 9/2015 | Bretschneider | ....... | F21V 29/763 362/373 |
| 2016/0081225 A1* | 3/2016 | Taketomi | .................. | F28F 1/12 165/80.3 |
| 2017/0339790 A1* | 11/2017 | Wittmann | .............. | H05K 7/205 |

* cited by examiner

ARRANGEMENT FOR CONDUCTING HEAT AWAY FROM AN ELECTRONIC COMPONENT

CROSS REFERENCE TO RELATED APPLICATION

This application claims priority of European patent application no. 20 183 240.9, filed Jun. 30, 2020, the entire content of which is incorporated herein by reference.

TECHNICAL FIELD

The invention relates to an arrangement having a heat sink for dissipating heat of an electronic component mounted on a circuit board, such as an electronic power component, for example of a power transistor, of a MOSFET of a shunt resistor or the like.

BACKGROUND

The requirements set for electronic components for controlling and/or switching electric loads are very high. The large-scale integration progressing in technology leads to components of small construction which have to control ever higher currents. This leads to exhaust heat in the electronic component which is technically inevitable and has to be dissipated by way of corresponding heat sinks. The heat sinks here are connected indirectly or directly in a heat transmitting manner to the electronic component per se and enlarge the heat-dispensing surface.

If a plurality of components are disposed so as to be close next to one another on a circuit board, the exhaust heat can lead to an impermissible operating temperature of the components, and an excessive temperature may cause the components to fail. Therefore, at least one thermally conducting path for dissipating in particular the bottom heat and expediently also the top heat of the component can also be provided in a circuit board for electronic functional groups. A heat conducting connection has to be established between the heat sink, which in most instances bears on the electronic component, and the heat conducting path, for example by way of heat conducting intermediate pieces. The intermediate pieces, when disposed, disturb an effective thermal flow.

SUMMARY

It is an object of the invention to provide an arrangement for conducting heat away from an electronic component mounted on a circuit board, by way of which heat sink the bottom heat of the electronic component can be effectively dissipated.

The above is achieved in that the heat sink by way of a foot section bears directly on a heat conducting section of the circuit board that dissipates the bottom heat such that the bottom heat is swiftly dissipated by way of the heat conducting section of the circuit board and the heat sink. Furthermore, the heat sink in the foot region is configured so as to have a recess in which the electronic component is at least partially received. It is achieved as a result thereof that the foot section bears directly on the heat conducting section of the circuit board without intermediate pieces being used, as a result of which a positive heat transfer is achieved.

Two foot sections are advantageously configured on the base body of the heat sink. It is expediently provided here that one foot section is in each case configured on mutually opposite sides of the recess.

In an advantageous embodiment, the circuit board on opposite sides of the electronic component has in each case at least one heat conducting section, wherein the heat sink spans the electronic component and bears on the heat conducting sections of the circuit board. The heat sink is thus connected in a heat transmitting manner to the heat conducting sections of the circuit board on both sides of the electronic component, as a result of which a positive dissipation of the bottom heat is ensured. In particular, the heat sink bears directly on both heat conducting sections. The term "directly" means that no further constructive elements are disposed between the heat sink and the heat conducting sections. If required, a heat conducting material in the form of a pad or a thermal paste or a thermally conducting adhesive may be provided between the heat sink and the heat conducting sections of the circuit board. In particular, the heat sink spans the electronic component in the manner of a bridge.

In an embodiment of the invention it is provided that a plurality of electronic components, in particular power components, are disposed next to one another in a row along at least one heat conducting section of the circuit board. The electronic components, such as power components, which are disposed in a row, conjointly with the assigned heat conducting sections of the circuit board, are assigned a common heat sink. The heat sink here is expediently configured in such a manner that the electronic components, or power components, of the row lie in a common recess of the heat sink, and the heat sink by way of at least one foot section on a heat conducting section bears on the circuit board next to the electronic opponents, or power components, respectively.

The heat sink has in particular in each case one foot section on both sides of the recess, the foot section extending at least across the length of one electronic component or a row of electronic components, or power components, respectively.

If a plurality of electronic components, or power components, respectively, are provided in a row, the heat sink, in particular in the manner of a web, has foot sections which run on both sides of the recess and extend across the length of the row of the electronic components. Each foot section on both longitudinal sides of the row preferably bears in each case directly on a heat conducting section of the circuit board.

In a particular embodiment, it is provided that at least one centering element, which is established on the circuit board and is suitable and specified for aligning the heat sink relative to the electronic component, engages in the recess of the heat sink. It is in particular provided that at least one centering element is disposed in a row having at least one electronic component. The centering element which is established on the circuit board engages in the recess and, on account of the position of the centering element in the recess, aligns the heat sink relative to the electronic component. The clearance is in particular configured so as to be larger than the component. The component lies in the recess so as to have a lateral spacing. As a result of the alignment of the heat sink relative to the electronic component it is guaranteed that the, in particular electrically conducting, heat sink does not come into contact with the often numerous connectors of the electronic component, so that electrical short circuits are reliably avoided. The centering element moreover guarantees a precise positioning of the heat sink on the heat conducting section so that a positive heat transfer is guaranteed, thus ensuring a positive dissipation of heat.

The increase of the operating temperature of the electronic component beyond a permissible temperature can be reliably prevented.

For a precise alignment of the position of the centering element in the receptacle, and thus the position of the heat sink on the circuit board, it is provided the length of a centering element, measured transversely to the heat conducting section, corresponds to the width of the recess in the heat sink in such a manner that a centering element which engages in the recess is suitable for aligning the heat sink transversely to the longitudinal direction of the heat conducting section and of the electronic component.

The centering element advantageously has a height which is smaller than or equal to the depth of the recess in the heat sink, in particular being the height of the component above the surface of the circuit board. When the depth of the recess in the heat sink in an embodiment is furthermore adapted to the construction height of the electronic component above the surface of the circuit board, an electronic component, or power component, respectively, which lies in the recess can advantageously come into contact with the base of the recess, as a result of which the top heat of the electronic component, or of the power component, respectively, can be reliably dissipated.

The centering element in terms of the basic shape thereof can be configured as a rectangle, wherein the length of the centering element is expediently adapted to the width of the recess in the heat sink, on the one hand, and advantageously spans the spacing between the heat conducting sections of a row, on the other hand. The centering element can be composed of a heat conducting material. The centering element is advantageously composed of a material which is not electrically conducting.

In order for tolerances during the mechanical mounting of the centering elements on the circuit board to be compensated, it is provided that the corners of the centering element are radiused. As a result thereof it can be guaranteed that slight errors in terms of the positioning angle of the centering element which arise during mounting do not lead to mounting problems when placing the heat sinks on the row of electronic components, or an individual power component, respectively.

In an embodiment, the end faces of the rectangular centering elements are embodied so as to be radiused. The radiused end faces preferably form segments of a circle, wherein the end faces lie so as to have a radius to one center of a circle.

In order for the heat sink to be aligned relative to a row of electronic components, or power components, respectively, it is provided that at least one centering element is disposed in a row having at least one electronic component. The length of the centering element, measured transversely to the heat conducting section, corresponds to the width of the recess in the base body of the heat sink in such a manner that a centering element which engages in the recess is suitable for aligning the heat sink transversely to the longitudinal direction of the row of electronic components, or power components, respectively. An electrical contact between the heat sink and the terminal lugs of the electronic components, or of the power components, respectively, can be reliably avoided in this way.

It is preferably provided that at least one centering element is disposed in the start section and in the end section of a row of electronic components. One centering element expediently forms a start of a row, and one centering element an end of a row of the electronic components, or power components, respectively. A precise alignment of the heat sink relative to the row is guaranteed as a result of the disposal of the centering element in the end section and in the start section of a row.

It is in particular provided that the electronic component lies in the recess so as to be connected in a heat transmitting manner so that the top heat of the electronic component can also be dissipated. The configuration of the heat sink with a view to simultaneously thermally contacting the heat conducting section of the circuit board and the electronic component leads to a compact construction mode which offers a high degree of efficiency for dissipating the operating heat of the electronic component.

The electronic component has a bottom side, facing the circuit board, and a top side, facing away from the circuit board. The bottom side of the electronic component for dissipating bottom heat is connected in a heat transmitting manner to the heat conducting section of the circuit board. The top side of the electronic component for dissipating top heat can advantageously be connected in a heat transmitting manner to the base of the recess of the heat sink. The configuration here is such that the top side of the component and the heat conducting sections in the circuit board contact the heat sink directly in a heat transmitting manner. The base of the recess of the heat sink can bear directly on the top side of the component, wherein a heat conducting material in the form of a pad, a thermal paste, or a thermally conducting adhesive, a gas (for example air) or a vacuum, can be provided between the top side of the component and the base of the recess. The heat transfer from the component to the heat sink can take place directly by way of heat transmission or indirectly by way of convection or radiation.

BRIEF DESCRIPTION OF THE DRAWINGS

The invention will now be described with reference to the drawings wherein.

DESCRIPTION OF THE PREFERRED EMBODIMENTS

Figure 1:
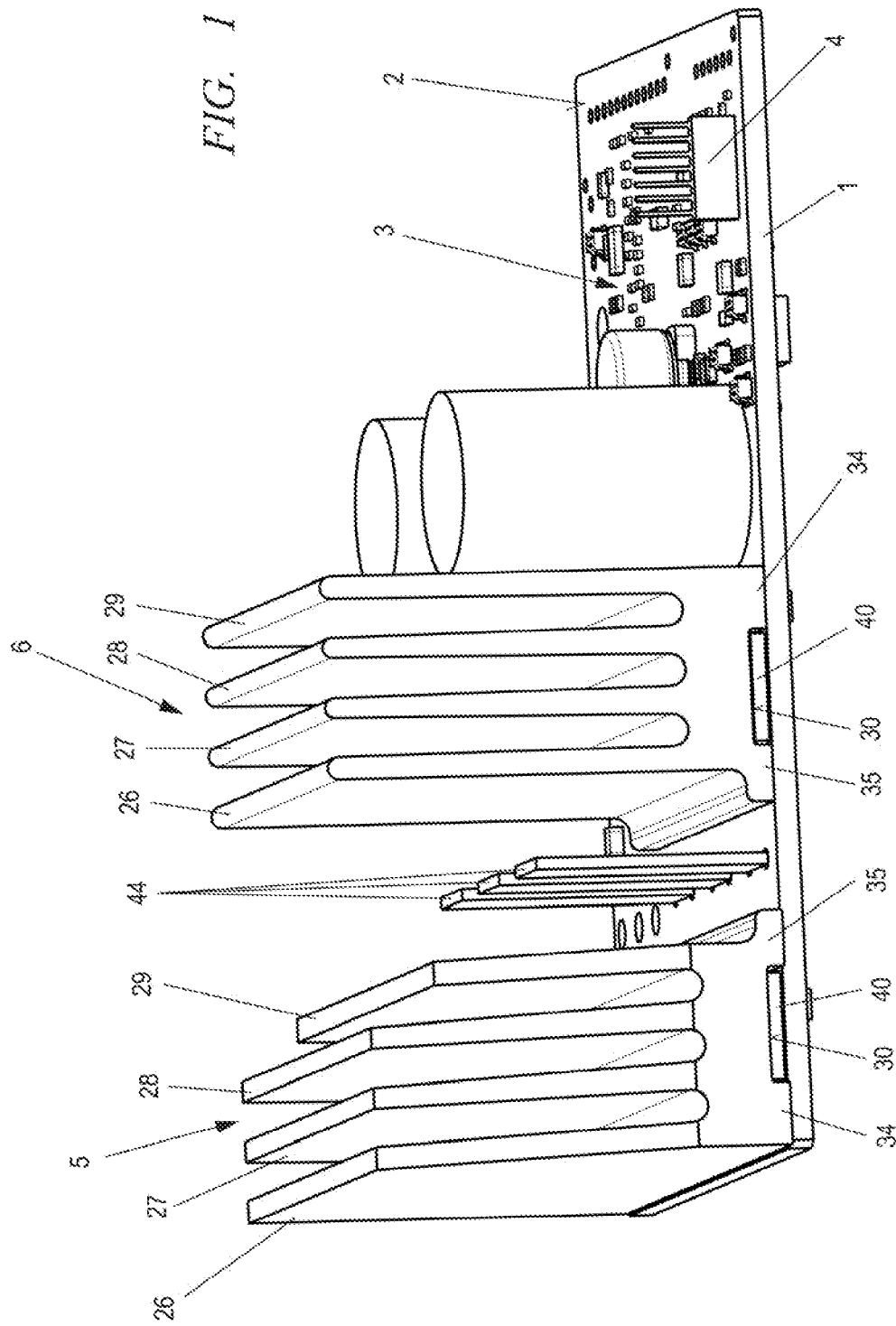
FIG. 1 in a schematic illustration shows a device for dissipating heat from electronic components which are disposed on a circuit board, such as power components, by way of a heat sink.

The circuit board 1 shown in FIG. 1, in particular on the circuit board top side 2 thereof, supports a multiplicity of electronic components 3 of which some electronic components 3 are configured as power components 7 to 14, and plug connections 4 for connecting to further electronic functional groups and/or contact tongues 44 for supplying electric power to a load such as an EC motor or the like.

Figure 2:
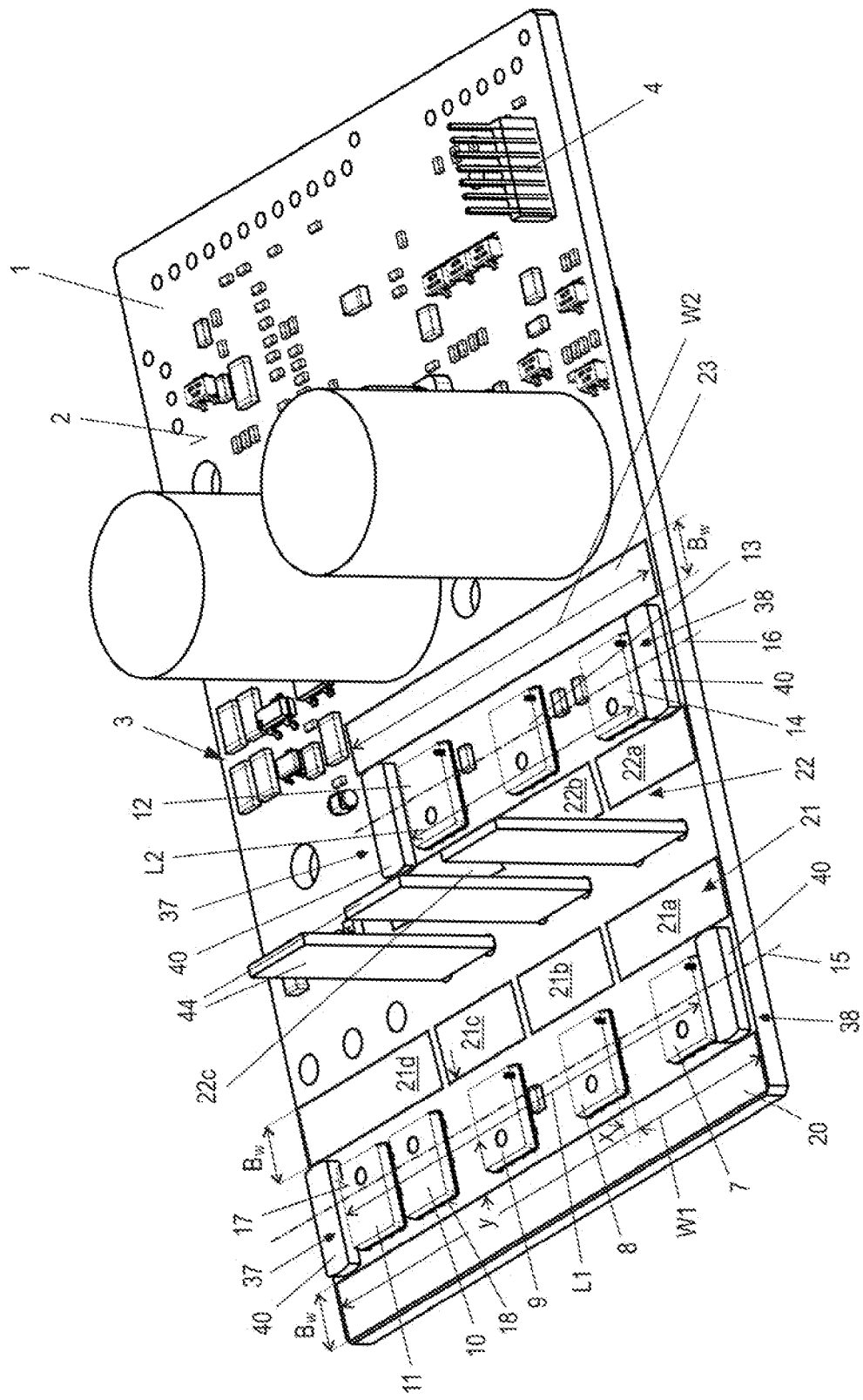
FIG. 2 in a schematic illustration shows a circuit board as per FIG. 1, having electronic components, such as power components, without a heat sink.

Heat sinks 5, 6 which are provided for the heat dissipation of the exhaust heat of the electronic components, in particular of the electronic power components 7 to 14, are held on the circuit board 1. The power components 7 to 11 in FIG. 2 are disposed in a row 15. The power components 12, 13 and 14 are disposed in a row 16. In the embodiment shown, the rows 15 and 16 are mutually parallel. Another arrangement may be expedient.

The device for dissipating heat of the electronic components 3 mounted on the circuit board 1 by way of a heat sink has heat conducting sections 20, 21, 22 and 23 which are configured on opposite sides, for example of a power component 7, or in the circuit board. Each electronic component, in particular the power components 7 to 14, on mutually opposite sides have in each case the heat conducting sections 20 to 23 which are in particular configured so as to be integral to the circuit board 1.

It may be expedient for a plurality of power components 7, 8, 9, 10, 11 to be assigned a common heat conducting section 20 which extends along the row 15 of the power components 7 to 11. A heat conducting section preferably extends across the entire length L1, L2 of a row 15, 16 of power components. In particular, the heat conducting section 20 and/or 21 lie/lies so as to be parallel to the row 15 of the power components 7 to 11. The heat conducting section 22 and/or 23 advantageously lie/lies so as to be parallel to the row 16 of the power components 12 to 14.

It may be advantageous for the heat conducting section assigned to an electronic component, or an electronic power component, respectively, to be configured separately from the heat conducting section of a neighboring component, or power component, respectively. Hence, the heat conducting section 21 shown in FIG. 2 is composed of four sub-sections 21a, 21b, 21c and 21d. The sub-sections 21a, 21b and 21c are in each case assigned to a single power component 7, 8 and 9, respectively, while the sub-section 21d is assigned to two neighboring power components 10 and 11. The heat conducting section 21 which is assembled from the sub-sections 21a, 21b, 21c and 21d has a length W1 which is larger than the length L1 of the row of power components 7 to 11.

The row 16 of electronic components, or electronic power components 12, 13 and 14, respectively, on one side of the row 16 accordingly has an in particular continuous common heat conducting section 23. On the other side of the row 16 of power components 12 to 14, each power component 12, 13 and 14 is assigned a dedicated sub-section 22a, 22b, and 22c of the heat conducting section 22. The heat conducting section 22 which is assembled from the heat conducting sections 22a, 22b and 22c has a length W2 which is larger than the length L2 of the row 16.

The length W1 of the heat conducting sections 20 and 21 is approximately 10% to 30% longer than the length L1 of the row 15 formed by the power components 7 to 11. The length W2 of the heat conducting sections 22 and 23 is approximately 10% to 30% longer than the length L2 of the row 16 formed by the power components 12 to 14.

Each power component 7 to 14 has a top side 17 and the bottom side 18. The bottom side 18 of the electronic component, or of the electronic power component 7 to 14, respectively, lies on the circuit board 1. The bottom side 18 of the electronic component, or of the electronic power component 7 to 14, respectively, here is connected in a heat transmitting manner to the circuit board 1, or the heat conducting sections 20, 21, 22 and 23 of the circuit board 1. The heat conducting sections 20, 21, 22 and 23 are composed of a positively heat conducting material. This heat conducting material can be applied to the circuit board 1, be fastened to the latter and/or be embedded in the circuit board.

Figure 3:
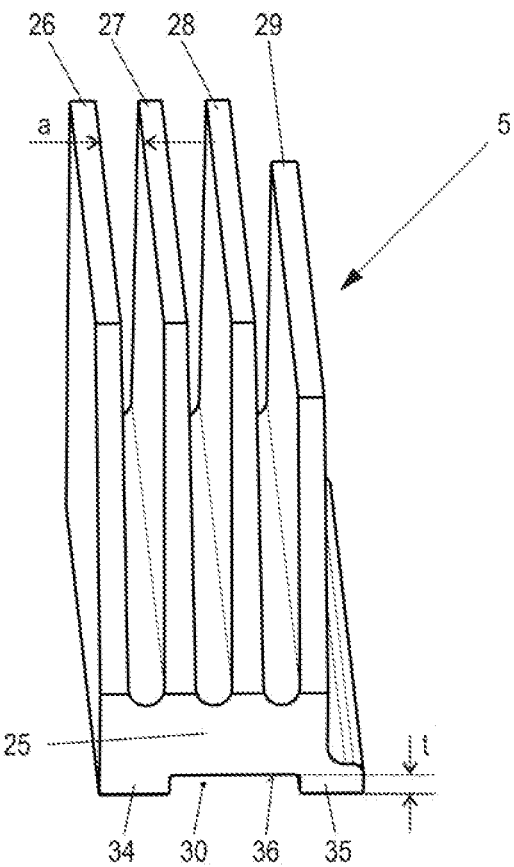
FIG. 3 shows a view of an embodiment of a first heat sink for an electronic component, such as a power component.
Figure 4:
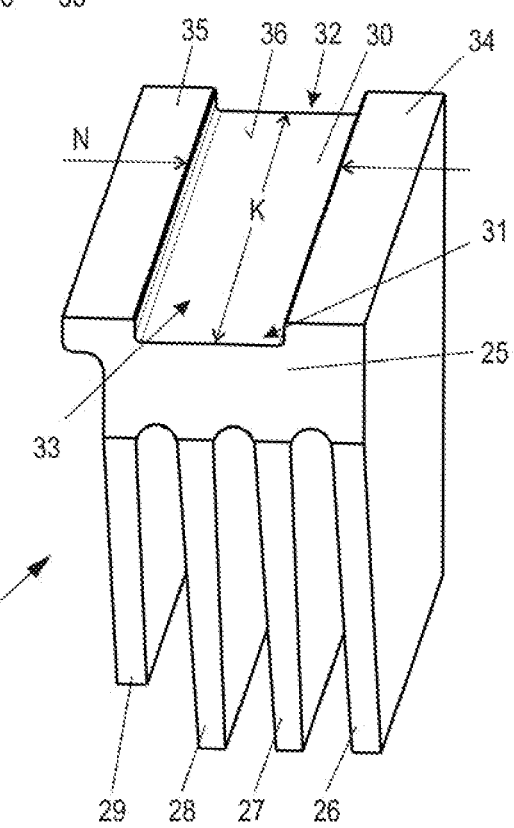
FIG. 4 shows a view of the first heat sink from below, having a receiving groove which runs in the longitudinal direction of the heat sink.
Figure 5:
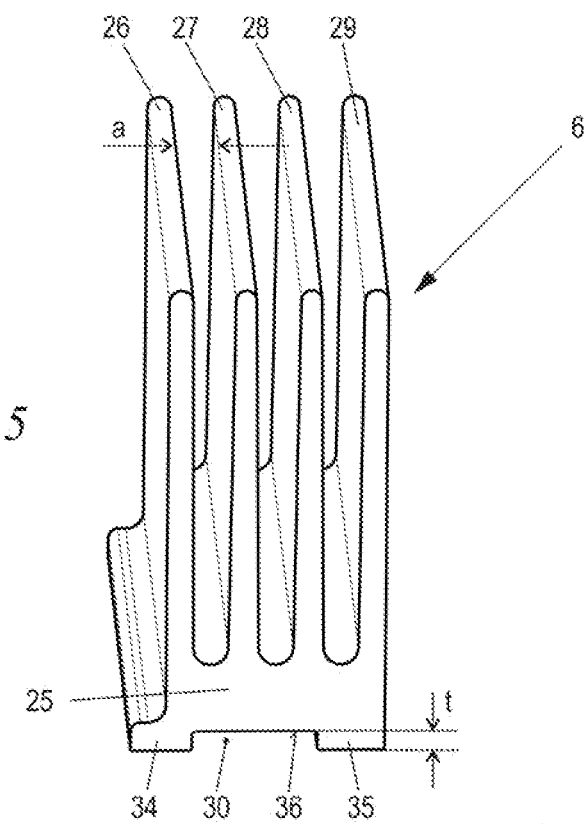
FIG. 5 shows a view of an embodiment of a second heat sink for electronic components, such as power components.
Figure 6:
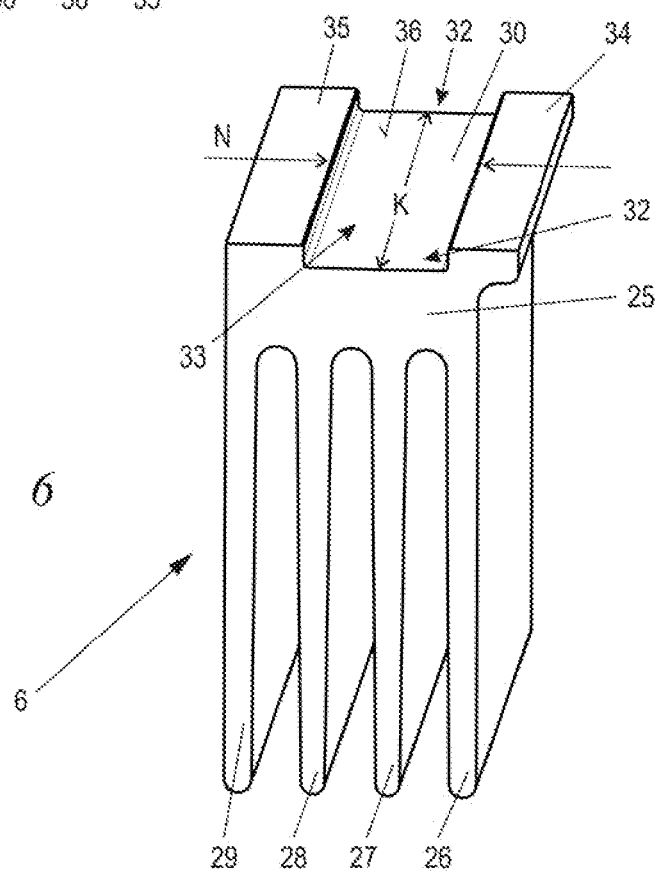
FIG. 6 shows a view of the second heat sink from below, having a receiving groove which runs in the longitudinal direction of the heat sink.

A first heat sink 5 is schematically illustrated in FIGS. 3 and 4, and a second heat sink 6 is schematically illustrated in FIGS. 5 and 6. Each heat sink is composed of a base body 25 having cooling ribs 26, 27, 28 and 29 disposed thereon. The cooling ribs 26, 27, 28 and 29 run in the longitudinal direction of the base body 25 and lie so as to be mutually spaced apart by a spacing a. The cooling ribs 26, 27, 28 and 29 can be configured so as to be of identical height; in the embodiment shown, the cooling rib 29 of the heat sink 5, at least across a partial length, has a lower height than the remaining cooling ribs 26, 27 and 28. The heat sink 6 illustrated in FIGS. 5 and 6 has cooling ribs of identical height.

The heat sinks 5 and 6 are of an identical basic construction, composed of the base body 25 and cooling ribs 26 to 29 disposed thereon, wherein a recess 30 is configured in the base body 25. As is shown in FIGS. 4 and 6, the recess 30 advantageously extends across the entire length K of the heat sink 5. The recess 30 at the ends 31 and 32 thereof is open. The recess 30 forms a receiving groove 33 which is incorporated in the base body 25.

Figure 9:
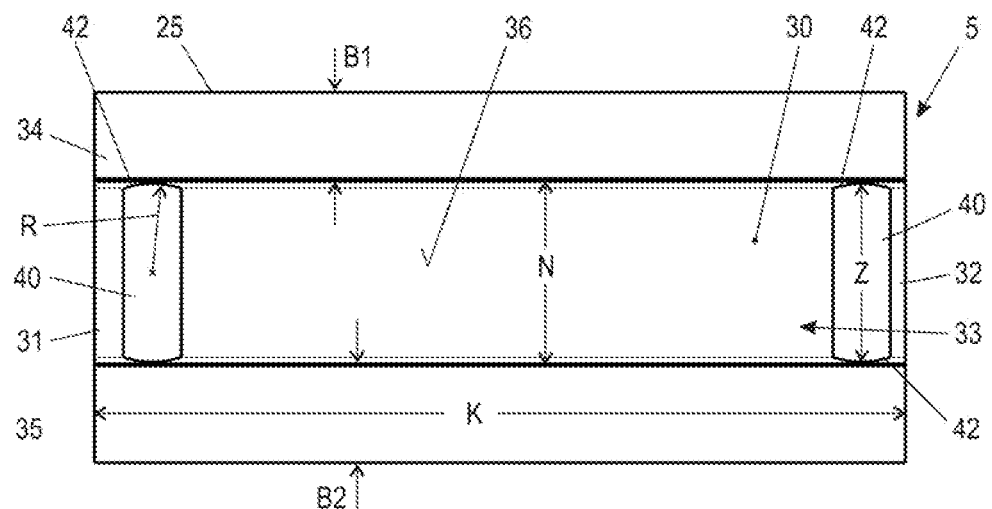
FIG. 9 in a schematic illustration shows a view from below of a recess which is configured as a longitudinal groove in a heat sink, having centering elements which engage in the recess.

The base body 25 of the heat sink 5 or 6, respectively, has two foot sections 34 and 35 which are in particular configured as foot webs and delimit the recess 30, or the receiving groove 33, respectively (FIGS. 4, 6 and 9). The foot sections 34, 35 preferably extend across the entire length K of the heat sink 5 and have a width B1 and B2, respectively (FIG. 9), the widths being configured so as to be adapted to the width $B_W$ of a heat conducting section 20, 21, 22 and 23. With a view to a positive heat transfer from a heat conducting section 20, 21, 22 or 23 to the heat sink 5 and 6, respectively, it is advantageous for the width B1 or B2, respectively, of the foot section 34 and 35 of the heat sink that bears on the heat conducting section 20, 21, 22 and 23 to correspond to at least the width $B_W$ of a heat conducting section 20, 21, 22 and 23. The width B1 or B2, respectively, of the foot section 34 or 35, respectively, of the heat sink 5 or 6, respectively, preferably is in particular 80% to 120% of the width $B_W$ of the heat conducting section 20, 21, 22 or 23. The width B1 or B2, respectively, advantageously corresponds in particular to 90% to 110% of the width $B_W$ of the heat conducting section. In one advantageous embodiment, the width B1 or B2, respectively, is chosen so as to be 95% to 105% of the width $B_W$ of the heat conducting section.

Figure 7:
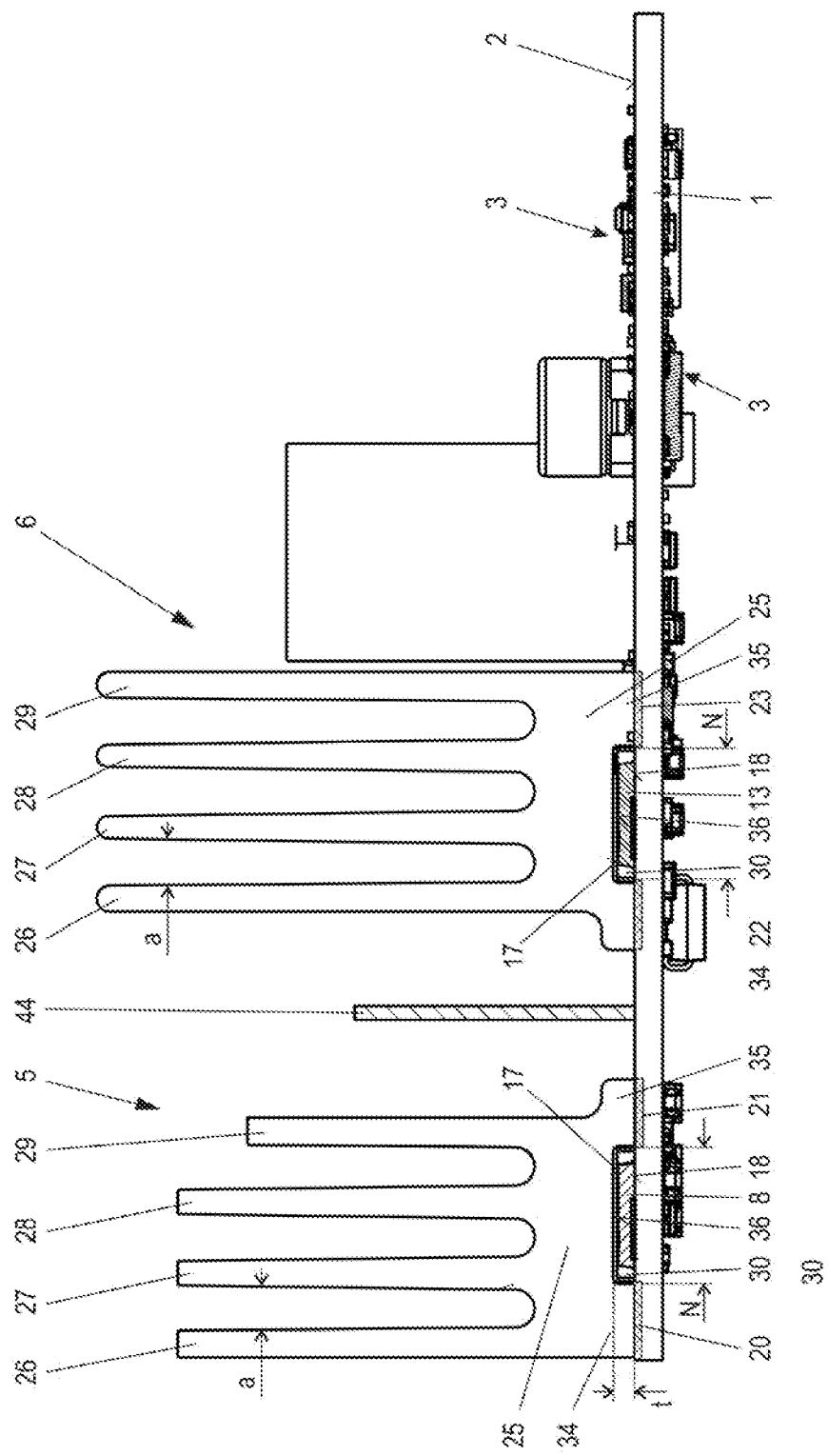
FIG. 7 in a schematic illustration shows a section through the device for dissipating heat from electronic components which are disposed on a circuit board, such as power components, and disposed heat sinks as per FIG. 1.
Figure 8:
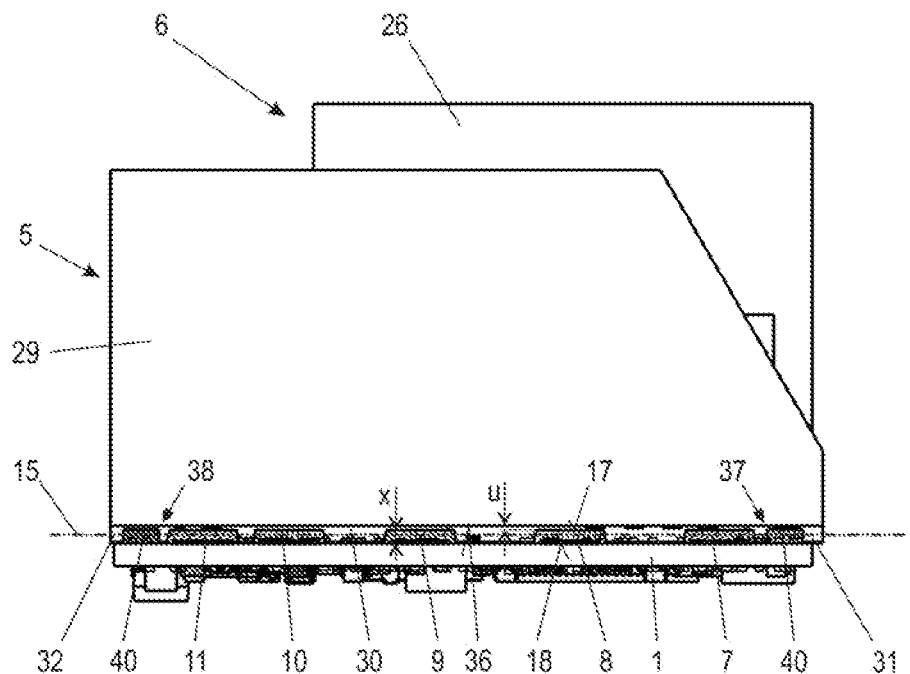
FIG. 8 in a schematic illustration shows a longitudinal section through the circuit board as per FIG. 1 at the height level of the first heat sink.

As is shown in FIGS. 1, 7 and 8, the heat sinks 5 and 6 are placed onto the rows 15 and 16 of the power components 7 to 11, or 12 to 14, respectively, in such a manner that the foot sections 34 and 35 thereof bear in each case directly on one heat conducting section 20 and 21, or 22 and 23, respectively, of the circuit board 1. The arrangement is such that the electronic power components 7 to 11 of the row 15, or the power components 12 to 14 of the row 16, respectively, are received in the respective recess 30 of the heat sink 5 and 6, respectively, placed thereon. All power components 7 to 11 of the row 15 advantageously lie in a common recess 30, and/or all power components 12 to 14 of the row 16 advantageously lie in a common recess 30 of the assigned heat sink 5, 6. The electronic power components 7 to 11 of the row 15, or the power components 12 to 14 of the row 16, respectively, in the recess 30 can preferably be connected in a heat transmitting manner to the heat sink 5 or 6, respectively.

Instead of a common recess 30 in the heat sink 5, 6, it may be expedient for a separate receptacle to be configured for each component or power component, such that the base body of a heat sink 5, 6 has a plurality of individual, mutually separate, receptacles. Configuring the individual receptacles so as to form a common recess 30 is an advantageous embodiment of the invention.

As is shown in FIGS. 1 and 7, the foot sections 34 and 35 of a heat sink 5 or 6, respectively, on opposite sides of an electronic component, or of a power component, respectively, bear in each case on one heat conducting section. The heat sink 5 or 6, respectively, thus forms a bridge which spans the electronic component, or the power component 7 to 14, respectively. The arrangement here is in particular such that the foot sections 34 and 35 of a heat sink 5 or 6, respectively, bear directly on the heat conducting sections 20 and 21, or 22 and 23, respectively. It may be expedient for a heat conducting material to be disposed between a foot section 34 and 35 of a heat sink 5 or 6, respectively, and a heat conducting section 20 and 21, or 22 and 23, respectively, of the circuit board 1. A heat conducting material of this type can be provided in the form of a pad, a thermal paste, a thermally conducting adhesive or a like material.

The heat sink 5 or 6, respectively, by way of the foot sections 34 and 35 thereof, is connected in a heat transmitting manner to the heat conducting sections 20 and 21, or 22 and 23, respectively, of the circuit board 1. At the same time, the heat sink 5 or 6, respectively, within the recess 30 is advantageously connected in a heat transmitting manner to the electronic component, or the electronic power component, respectively, in particular in order to dissipate top heat. The top side 17 of a power component 7 to 14 expediently bears in a heat transmitting manner on the base 36 of the recess 30. A heat transmitting material is advantageously provided in the gap u (FIG. 8) between the top side 17 of the power component and the base 36 of the recess 30. The heat transmitting material can be provided in the form of a pad, a thermal paste, a thermally conducting adhesive or a like material. Furthermore provided may be a gas (for example air) or a vacuum, wherein the heat transfer from the component to the heat sink takes place by way of convection or radiation.

The heat sinks 5 and 6 are composed of a positive heat conducting material. A positive heat conducting material is often electrically conducting. Hence, it has to be ensured that the heat sinks 5 and 6 when being mounted on the power components 7 to 14 are not in electrical contact with the terminal lugs of the power components. It is provided according to the invention that at least one centering element 40 which is established on the circuit board 1 engages in the recess 30. The centering element 40 is specified and suitable for aligning the disposed heat sink 5 or 6, respectively, relative to the electronic component, or the power component 7 to 14, respectively. At least one centering element 40 is provided in a row having at least one electronic component, or power component, respectively.

As is shown in FIGS. 2 and 8, at least one centering element 40 is provided in the start section 37 and in the end section 38 of a row 15 or 16, respectively, of the electronic power components 7 to 14. In an advantageous configuration, a centering element 40 forms the start and the end of a row 15 or 16, respectively, of the power components 7 to 11, or 12 to 14.

The centering element 40 in the embodiment shown is configured so as to be substantially rectangular, as is shown in particular in FIGS. 9 to 12. A centering element 40 here has a length Z which corresponds to the width N of the recess 30, measured transversely to the length K (FIG. 9) of the heat sink 5 and 6, respectively. The length Z of the centering element 40 is advantageously shorter than the width N of the recess 30. The length Z advantageously corresponds to 90% to 100% of the width N of the recess. The length Z corresponds in particular to 95% to 98% of the width N of the recess 30.

The length Z of a centering element 40 corresponds to the width N of the recess 30 in such a manner that a centering element 40 which engages in the recess 30 is suitable for aligning the heat sink 5 or 6, respectively, transversely to the longitudinal direction of an electronic component, or of a power component 7 to 14, respectively, or a row 15 or 16, respectively, of the electronic components, or of the power components 7 to 14, respectively. In this way, any electrical contact between the heat sink 5 or 6, respectively, which spans a power component 7 to 14, and the terminal lugs of the power components 7 to 14, is reliably avoided.

In a particular embodiment of the invention it is provided that the length Z of the centering elements 40 corresponds to the spacing y (FIG. 2) of the heat conducting sections 20, 21, or 22, 23, respectively, that are assigned to a row 15 or 16, respectively. The length Z of the centering element 40 preferably corresponds in particular to 95% to 100% of the spacing y of the heat conducting sections 20, 21, or 22, 23, respectively, that are assigned to a power component 7 to 14.

A power component 7 to 14 to be cooled by the heat sink 5 or 6, respectively, has a construction height x (FIG. 8). All power components 7 to 11 of the row 15, and all power components 12 to 14 of the row 16, preferably have the same construction height x. The depth t of the recess 30 advantageously corresponds to the construction height x of a power component; the depth t is in particular 0.5% to 2% deeper than the construction height x of a power component 7 to 14. The depth t is dimensioned such that all power components of a row 15 or 16, respectively, by way of the top side 17 thereof contact the base 36 of the recess 30 in a heat conducting manner, optionally while inserting a heat conductive material such as a pad, a thermal paste, or a thermally conducting adhesive.

In order for a heat sink 5, 6 to be aligned on the circuit board 1, the centering element 40 is mechanically established on the circuit board 1. The centering element 40 has a height c which advantageously corresponds to the depth t of the recess 30 in the heat sink 5 and 6, respectively, or is expediently less than the depth t. If the depth t of the recess 30 in the heat sink 5 or 6, respectively, in an embodiment is adapted in particular to the construction height x of the electronic component 3, or of the power component 7 to 14, respectively, it can advantageously be achieved that the top side 17 of a power component 7 to 14 contacts the heat sink 5 or 6, in a positively heat conducting manner. The height c of the centering element 40 is less than or equal to the construction height x of the power component 7 to 14. The height c of the centering element 40 is preferably smaller than the construction height x of the power component such that the centering element 40 in terms of the function thereof serves only for aligning the heat sink transversely to the row 15 or 16, respectively, of the power components 7 to 14.

Figure 10:
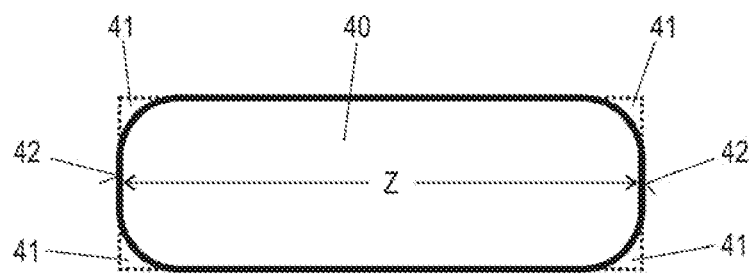
FIG. 10 shows a plan view of a rectangular centering element having radiused corners.

The centering element 40 can have the rectangular shape illustrated with dashed lines in FIG. 10. When the centering plates 40 are mounted so as to be positionally accurate on the circuit board 1, it is possible for the heat sink 5 or 6, respectively, to be placed onto the centering element 40. If the corners 41 of the centering element 40 are radiused, as is illustrated in FIG. 10, position deviations in terms of the position of the centering element 40 on the circuit board 1 can be compensated. By virtue of the radiused corners of the centering element 40 as per FIG. 10, simple mounting of the heat sink 5 or 6, respectively, is guaranteed even in the case of different angular positions of the centering elements 40 in a row 15 or 16, respectively. It is illustrated in FIG. 9 how a sufficient positional alignment of the heat sink 5 or 6, respectively, by the centering elements 40 of a row 15 or 16, respectively, is achieved by way of disposed centering elements 40 of a row.

Figure 11:
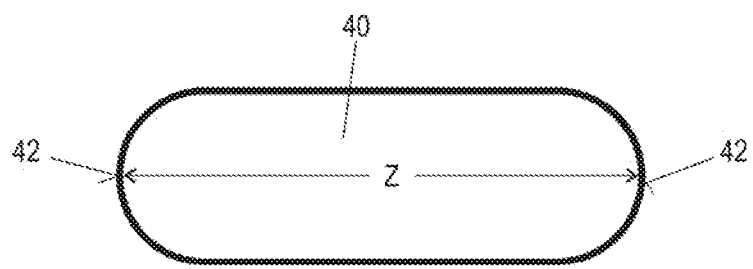
FIG. 11 shows a plan view of a rectangular centering element having radiused and faces; and, FIG. 12 shows a lateral view of a centering element as per FIGS. 10 and 11.
Figure 12:
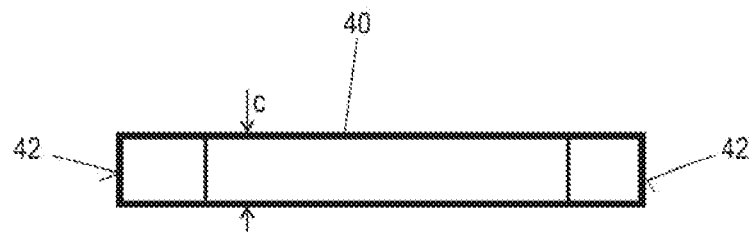

In a further configuration of a centering element 40 as per FIG. 11 it is provided that the end faces 42 of the centering element 40 are embodied so as to be radiused. The end faces 42 are preferably configured as semi-circular arcs. In a particular embodiment of a centering element 40, an end face can be radiused using a radius R which corresponds in particular to half the length Z of a centering element 40. It can be advantageous for the radius R of the radiused feature of an end face to be configured even larger, for example in a range from half the length Z to a multiple of Z, for example five times the length Z.

It is understood that the foregoing description is that of the preferred embodiments of the invention and that various changes and modifications may be made thereto without departing from the spirit and scope of the invention as defined in the appended claims.

What is claimed is:

1. An arrangement for conducting heat away from an electronic component mounted on a circuit board, the arrangement comprising:
    a heat sink;
    at least one heat conducting section formed on said circuit board and configured to conduct heat away from said electronic component;
    said heat sink being disposed so as to define a heat transferring connection with said at least one heat conducting section of said circuit board;
    said heat sink having a foot section positioned directly on said at least one heat conducting section of said circuit board; said heat sink having a base body;
    said base body having a recess formed therein;
    said electronic component being disposed at least partially in said recess;
    at least one centering element fixedly mounted on said circuit board so as to engage into said recess; and, said at least one centering element being configured to align said heat sink relative to said electronic component; and,
    said recess having a width (N) and said at least one centering element having a length (Z) extending transversely to said at least one heat conducting section and corresponding to said width (N) so as to cause said at least one centering element engaging into said recess to be suitable to align said heat sink transversely to the longitudinal direction of said at least one heat conducting section and to said electronic component,
    wherein a plurality of said electronic components are arranged alongside said at least one heat conducting section of said circuit board in a row one next to the other; said row of said electronic components has a beginning and an end; and, said arrangement further comprises first and second centering elements disposed at said beginning and said end, respectively.

2. The arrangement of claim 1, wherein said foot section is a first foot section and said heat sink has a second foot section; and, said first and second foot sections are configured on mutually opposite sides of said recess.

3. The arrangement of claim 2, wherein:
    said at least one heat conducting section is a first heat conducting section;
    said arrangement further includes a second heat conducting section formed on said circuit board;
    said first and second heat conducting sections are disposed on mutually opposite sides of said electronic component; and,
    said heat sink straddles said electronic component as a bridge with said first and second foot sections standing directly on corresponding ones of said first and second heat conducting sections.

4. The arrangement of claim 2, wherein said first and second foot sections extend over the length of said electronic component.

5. The arrangement of claim 1, wherein a plurality of said electronic components are arranged in a row one next to the other alongside said at least one heat conducting section; and, said heat sink is assigned in common to said plurality of said electronic components and said at least one heat conducting section.

6. The arrangement of claim 5, wherein said plurality of said electronic components are all arranged in said recess so as to cause said recess to be common thereto.

7. The arrangement of claim 5, wherein said foot section is a first foot section and said heat sink has a second foot section; said first and second foot sections are configured on mutually opposite sides of said recess; and, said first and second foot sections extend over the length of said row of said electronic components.

8. The arrangement of claim 1, wherein said at least one centering element lies in a row with said electronic component.

9. The arrangement of claim 1, wherein said recess has a depth (t); and, said at least one centering element has a height (c) which is equal to or less than said depth (t) of said recess.

10. The arrangement of claim 1, wherein said at least one centering element has rounded corners.

11. The arrangement of claim 1, wherein said at least one centering element has rounded corners and a rounded end face.

12. The arrangement of claim 1, wherein said electronic component in said recess is in heat transferring communication with said heat sink.

13. The arrangement of claim 1, wherein:
    said recess of said base body of said heat sink has a base;
    said electronic component has a lower side facing said circuit board and an upper side facing away from said circuit board;
    said lower side is in heat transferring communication with said at least one heat conducting section of said circuit board for removal of bottom heat; and, said upper side is in heat transferring communication with said base of said recess for removal of top heat.

14. The arrangement of claim 1, wherein said electronic component is an electronic power component.

15. An arrangement for conducting heat away from an electronic component mounted on a circuit board, the arrangement comprising:
a heat sink;
at least one heat conducting section formed on said circuit board and configured to conduct heat away from said electronic component;
said heat sink being disposed so as to define a heat transferring connection with said at least one heat conducting section of said circuit board;
said heat sink having a foot section positioned directly on said at least one heat conducting section of said circuit board;
said heat sink having a base body;
said base body having a recess formed therein;
said electronic component being disposed at least partially in said recess;
at least one centering element fixedly mounted on said circuit board so as to engage into said recess;
said at least one centering element being configured to align said heat sink relative to said electronic component;
wherein a plurality of said electronic components are arranged alongside said at least one heat conducting section of said circuit board in a row one next to the other; said row of said electronic components has a beginning and an end; and, said arrangement further comprises first and second centering elements disposed at said beginning and said end, respectively.

16. An arrangement for conducting heat away from an electronic component mounted on a circuit board, the arrangement comprising:
a heat sink;
at least one heat conducting section formed on said circuit board and configured to conduct heat away from said electronic component;
said heat sink being disposed so as to define a heat transferring connection with said at least one heat conducting section of said circuit board;
said heat sink having a foot section positioned directly on said at least one heat conducting section of said circuit board;
said heat sink having a base body;
said base body having a recess formed therein;
said electronic component being disposed at least partially in said recess;
at least one centering element fixedly mounted on said circuit board so as to engage into said recess; and,
said at least one centering element being configured to align said heat sink relative to said electronic component;
wherein a plurality of said electronic components are arranged in a row having a beginning and end; and, said arrangement further comprises first and second centering elements disposed at said beginning and said end, respectively, to define the respective ends of said row.

* * * * *